United States Patent
Hwang et al.

(10) Patent No.: US 8,741,735 B1
(45) Date of Patent: Jun. 3, 2014

(54) METHOD OF FORMING A SEMICONDUCTOR MEMORY DEVICE

(71) Applicant: SK hynix Inc., Icheon-Si (KR)

(72) Inventors: Sung Min Hwang, Icheon-Si (KR); Hyeon Soo Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/173,552

(22) Filed: Feb. 5, 2014

Related U.S. Application Data (62) Division of application No. 13/108,501, filed on May 16, 2011, now Pat. No. 8,674,425.

(30) Foreign Application Priority Data

Feb. 7, 2011 (KR) .................................. 2011-10594

(51) Int. Cl.
  *H01L 21/76* (2006.01)
(52) U.S. Cl.
  USPC ............................................. 438/411
(58) Field of Classification Search
  CPC .................................................. H01L 21/764
  USPC ............................................................. 438/411
  See application file for complete search history.

(56) References Cited

U.S. PATENT DOCUMENTS

| | | | |
|---|---|---|---|
| 6,984,577 B1 * | 1/2006 | Zhao et al. | 438/619 |
| 2009/0243108 A1 * | 10/2009 | Gosset et al. | 257/758 |
| 2011/0309430 A1 * | 12/2011 | Purayath et al. | 257/321 |
| 2012/0178235 A1 | 7/2012 | Pachamuthu et al. | |

FOREIGN PATENT DOCUMENTS

KR   10-2008-0022380   3/2008

* cited by examiner

*Primary Examiner* — Bradley K Smith
(74) *Attorney, Agent, or Firm* — Marshall, Gerstein & Borun LLP (57) ABSTRACT

A semiconductor memory device includes a semiconductor substrate defining active regions partitioned by an isolation region, conductive lines spaced apart from each other and crossing the active regions over the semiconductor substrate, a thin film pattern formed on a top portion of the conductive lines having opening portions exposing part of the conductive lines in a width wider than a width of the conductive lines, an insulating layer filling the opening portions and formed over the thin film pattern, and an air gap formed between the conductive lines below the insulating layer and the thin film pattern.

20 Claims, 11 Drawing Sheets

METHOD OF FORMING A SEMICONDUCTOR MEMORY DEVICE

CROSS-REFERENCE TO RELATED APPLICATIONS

This is a division of U.S. application Ser. No. 13/108,501 filed May 16, 2011, which claims the priority benefit under USC 119 of Korean patent application number 10-2011-0010594 filed on Feb. 7, 2011, the entire disclosure of which is incorporated by reference herein, is claimed.

BACKGROUND

Exemplary embodiments relate generally to a semiconductor memory device and a method of manufacturing the same and, more particularly, to a semiconductor memory device and a method of manufacturing the same, which reduce an interference phenomenon between conductive lines.

A semiconductor memory device includes a plurality of memory cells. An electrical signal is supplied to the memory cells through conductive lines. An insulating layer is formed between the conductive lines, and the conductive lines are thus electrically insulated from each other. Accordingly, parasitic capacitance may be generated between the conductive lines adjacent each other with the insulating layer interposed therebetween. An interference phenomenon is generated between the conductive lines because of the parasitic capacitance, and increases with a reduction in the size of the gap between the conductive lines due to a high degree of integration of semiconductor memory devices.

Figure 1:
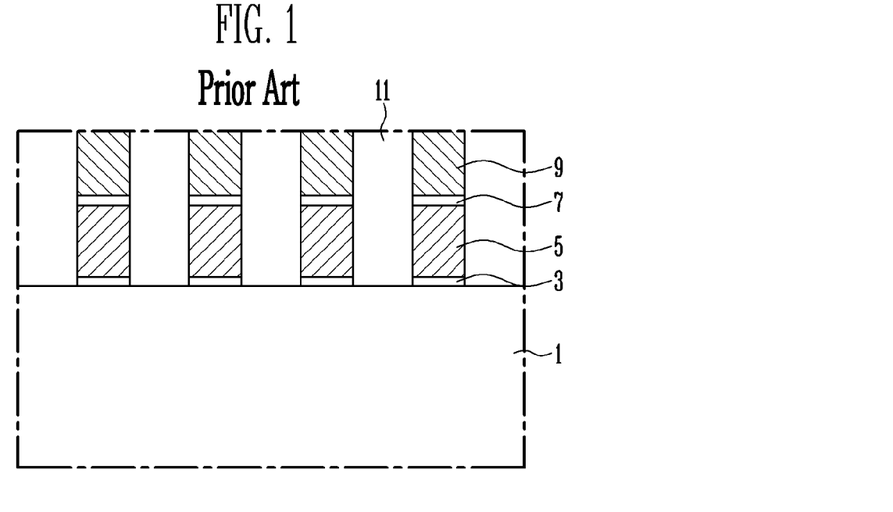
FIG. 1 is a cross-sectional view illustrating an interference phenomenon between the gate of a prior art NAND flash memory device.

FIG. 1 is a cross-sectional view illustrating an interference phenomenon between conductive lines, for example, in a conventional NAND flash memory device.

Referring to FIG. 1, a gate of the NAND flash memory device has a stack structure, including a gate insulating layer 3, a first conductive layer 5, a dielectric layer 7, and a second conductive layer 9 stacked over a semiconductor substrate 1. The first conductive layer 5 of a memory cell is used as a floating gate, and the second conductive layer 9 is used as a control gate. Furthermore, the control gates of the memory cell are coupled to a word line and are supplied with signals. An insulating layer 11 fills the spaces between the stack-type gates. With an increase in the degree of integration of semiconductor memory devices, the gap between the gates narrows and the interference phenomenon between the gates therefore tends to increase.

Figure 2:
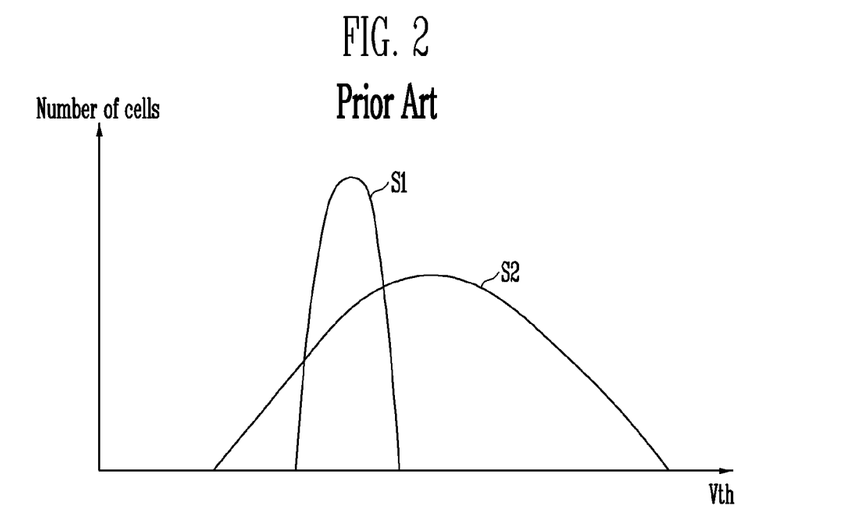
FIG. 2 is a diagram illustrating the deterioration of a threshold voltage distribution characteristic due to the interference phenomenon.

FIG. 2 is a diagram illustrating the deterioration of a threshold voltage distribution characteristic due to an increase of the interference phenomenon.

Referring to FIG. 2, it is ideal that threshold voltages Vth of memory cells having a specific program state are distributed as shown in S1. However, the distribution of program threshold voltages Vth of the memory cells may expand as shown in S2 due to the interference phenomenon between gates, leading to a reduction in the yield of semiconductor memory devices. Accordingly, there is a need for a method capable of reducing the interference phenomenon.

BRIEF SUMMARY

Exemplary embodiments relate to a semiconductor memory device and a method of manufacturing the same, which are capable of reducing an interference phenomenon between conductive lines by increasing the ratio occupied by an air gap between the conductive lines.

A semiconductor memory device according to a first exemplary embodiment of this disclosure includes a semiconductor substrate defining active regions partitioned by an isolation region; conductive lines spaced apart from each other and crossing the active regions over the semiconductor substrate; a thin film pattern formed on a top portion of the conductive lines defining opening portions of a width wider than the conductive lines exposing part of the conductive lines; an insulating layer filling the opening portions and formed over the thin film pattern; and an air gap formed between the conductive lines below the insulating layer and the thin film pattern.

A semiconductor memory device according to a second exemplary embodiment of this disclosure includes a semiconductor substrate defining active regions partitioned by an isolation region; conductive lines spaced apart from each other and crossing the active regions formed over the semiconductor substrate; thin film patterns spaced apart from each other and extending parallel to the active regions on a top portion of the conductive lines; an insulating layer filling a space between the thin film patterns and formed over the thin film patterns; and an air gap between the conductive lines below each of the thin film patterns.

A method of forming a semiconductor memory device according to a first exemplary embodiment of this disclosure comprises forming conductive lines spaced apart from each other and crossing active regions that are partitioned by an isolation region over a semiconductor substrate that defines the active regions; filling a gap-fill layer between the conductive lines; etching the gap-fill layer to lower a height of the gap-fill layer lower than a top surface of the conductive lines and to expose upper sidewalls of the conductive lines; forming a thin film pattern having opening portions to expose part of the gap-fill layer on a top surface of the gap-fill layer and on a surface of the conductive lines; removing remaining portions of the gap-fill layer; and forming an insulating layer on the thin film pattern to fill the opening portions, thereby forming an air gap between the conductive lines below the insulating layer and the thin film pattern.

A method of forming a semiconductor memory device according to a second exemplary embodiment of this disclosure comprises forming conductive lines spaced apart from each other and crossing active regions partitioned by an isolation region, over a semiconductor substrate that defines the active regions; filling a gap-fill layer between the conductive lines; etching the gap-fill layer to lower a height of the gap-fill layer lower than a top surface of the conductive lines and to expose upper sidewalls of the conductive lines; forming thin film patterns spaced apart from each other and parallel to the active regions on a top surface of the gap-fill layer and on a surface of the conductive lines to expose the gap-fill layer in a space between the thin film patterns; removing remaining portions of the gap-fill layer; and forming an air gap between the conductive lines below each of the thin film patterns by filling the space between the thin film patterns with an insulating layer.

BRIEF DESCRIPTION OF THE DRAWINGS

FIGS. 3 to 5 are diagrams illustrating a semiconductor memory device and a method of manufacturing the same according to a first exemplary embodiment of this disclosure; and FIGS. 6 to 9C are diagrams illustrating a semiconductor memory device and a method of manufacturing the same according to a second exemplary embodiment of this disclosure.

DESCRIPTION OF EMBODIMENTS

Hereinafter, some exemplary embodiments of the present disclosure are described in detail with reference to the accompanying drawings. The drawing figures are provided to allow those having ordinary skill in the art to understand the scope of the embodiments of the disclosure.

Figure 3:
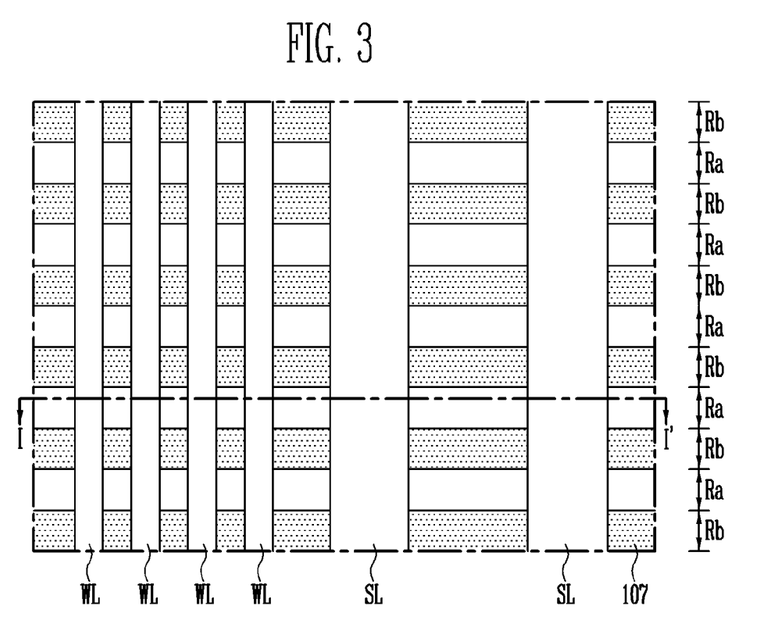

A semiconductor memory device and a method of manufacturing the same according to a first exemplary embodiment of this disclosure are described below with reference to FIGS. 3 to 5. FIG. 3 is a diagram illustrating the layout of conductive lines according to the first exemplary embodiment of this disclosure. FIGS. 4A to 4H are cross-sectional views illustrating the method of forming the semiconductor memory device according to the first exemplary embodiment of this disclosure. Furthermore, FIG. 5 is a diagram illustrating the layout of a photoresist pattern and the conductive lines. In particular, FIGS. 3 to 5 show a NAND flash memory device as an example.

Referring to FIG. 3, first conductive lines WL and second conductive lines SL are formed over a semiconductor substrate that defines active regions Ra partitioned by isolation regions Rb. The first conductive lines WL cross active regions Ra and are spaced apart from each other. The second conductive lines SL are parallel to the first conductive lines WL and to each other and have widths greater than the width of the first conductive lines WL. An isolation layer 107 is formed in each of the isolation regions Rb.

Although not shown, the plurality of first conductive lines WL is arranged between the second conductive lines SL to form one group, and the groups having the above arrangement are repeatedly arranged in series. The second conductive lines SL adjacent to each other at the boundaries of the groups are spaced apart from each other in a width wider than the width between the first conductive lines WL. The first conductive lines WL are the word lines of a NAND flash memory device, and the second conductive lines SL are the select lines of the NAND flash memory device. The select lines are classified into source select lines and drain select lines.

Figure 4A:
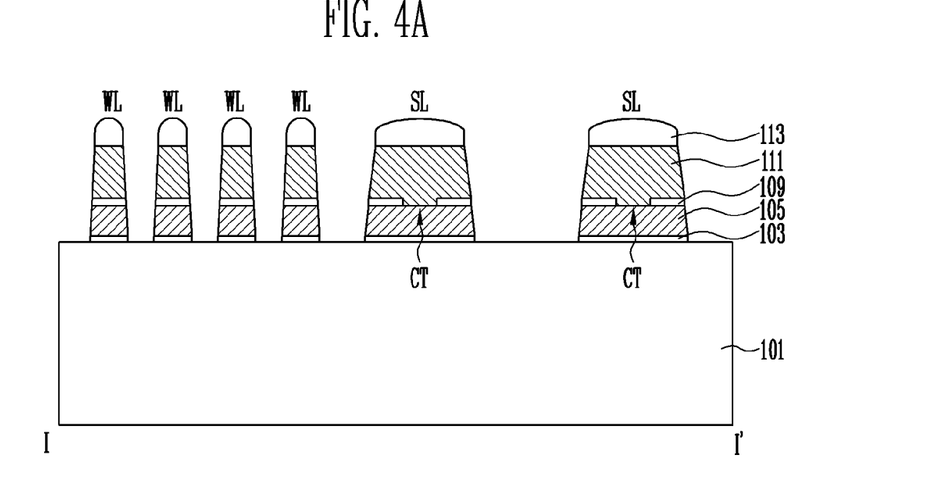
Figure 5:
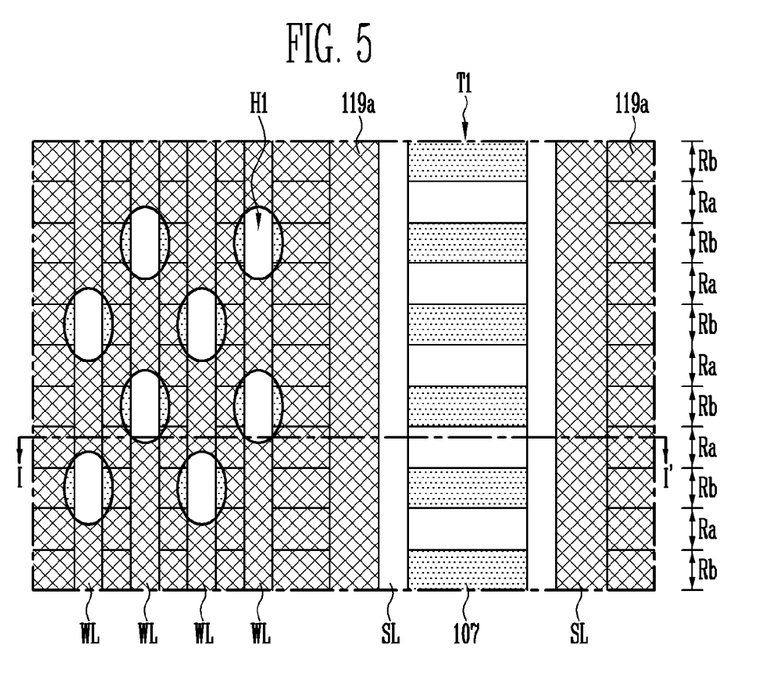

Referring to FIG. 4A showing the cross section taken along line I-I' in FIG. 3, when the first conductive lines WL and the second conductive lines SL are the word lines and the select lines of a NAND flash memory device, each of the first conductive lines WL and the second conductive lines SL is coupled to a stack-type gate, including a stack structure of a gate insulating layer 103, a first conductive layer 105, a dielectric layer 109, and a second conductive layer 111. A contact hole CT is formed in the dielectric layer 109 of the stack-type gate coupled to the second conductive line SL to expose the first conductive layer 105. The first conductive layer 105 and the second conductive layer 111 are electrically coupled through the contact hole CT. The gate insulating layer 103 of the stack-type gate coupled to the first conductive line WL becomes a tunnel insulating layer, and the first conductive layer 105 thereof becomes a floating gate (i.e., a charge trap layer). A gate hard mask pattern 113 may be further stacked on the second conductive layer 111.

The first conductive lines WL and the second conductive lines SL preferably are formed using the following method.

A well (not shown) is formed, and the gate insulating layer 103 and the first conductive layer 105 are stacked over a semiconductor substrate 101 into which ions for controlling a threshold voltage have been injected. The gate insulating layer 103 preferably comprises $SiO_2$ and preferably is formed using an oxidization process or an oxide deposition process. The first conductive layer 105 preferably comprises polysilicon. Next, part of the first conductive layer 105 formed over the isolation regions of the semiconductor substrate 101 and part of the gate insulating layer 103 are removed. To this end, isolation masks for opening portion the isolation regions are formed over the first conductive layer 105, and an etch process for removing the exposed regions of the first conductive layer 105 and the gate insulating layer 103 is performed using the isolation masks. Accordingly, the first conductive layer 105 and the gate insulating layer 103 remain over each of the active regions of the semiconductor substrate 101.

Next, an etch process for forming trenches in the semiconductor substrate 101 is performed to remove the isolation regions Rb of the semiconductor substrate 101, using the isolation masks as a mask. After forming the trenches, the inside of the trenches is filled with an insulating material, and the insulating material on the active regions is removed using a method, such as by Chemical mechanical polishing (CMP), for example. Next, the height of the insulating material is lowered using an etch process, thereby forming the isolation layers (107 of FIG. 3). The isolation layers 107 have a higher height than the gate insulating layer 103 to improve damage to the active regions, but to have a lower height than the first conductive layer 105 to improve the coupling ratio between a charge trap layer and a control gate and to improve an interference phenomenon between the charge trap layers. When the isolation layers 107 are formed to have a lower height than the first conductive layer 105, the area in which the first conductive layer 105 (i.e., the charge trap layer) and the second conductive layer 111 (i.e., the control gate layer) come into contact with each other is increased, thereby being capable of improving the coupling ratio between the charge trap layer and the control gate. After forming the isolation layers 107, the remaining isolation masks are removed.

Next, the dielectric layer 109 is formed on the entire surface including the surface of the first conductive layers 105 remaining on the active regions Ra. The dielectric layer 109 preferably has an ONO stack structure, including a silicon oxide layer, a silicon nitride layer, and a silicon oxide layer. In some embodiments, the dielectric layer 109 preferably is formed of a high dielectric constant (high-k) layer, including at least one of an $Al_2O_3$ layer, a $ZrO_2$ layer, and an $HfO_3$ layer having a high dielectric constant to improve the coupling ratio between the control gate and the charge trap layer and improve an interference phenomenon between the charge trap layers. Next, an etch process for forming the contact holes CT in the dielectric layer 109 is performed.

Next, the second conductive layer 111 is formed over the dielectric layer 109 to fill the contact holes CT. In preferred forms, the second conductive layer 111 may be a single layer of a polysilicon layer or may be multiple layers in which two or more of a polysilicon layer, a metal layer, and a metal silicide layer are stacked. Next, the gate hard mask patterns 113 to cross the active regions Ra are formed over the second conductive layer 111. Next, part of the dielectric layer 109 is exposed by removing the second conductive layer 111 exposed between the gate hard mask patterns 113 using an etch process. Next, the exposed region of the dielectric layer 109 is removed using an etch process, thereby exposing a part of the first conductive layer 105. Next, the exposed region of the first conductive layer 105 is removed using an etch process. Here, the gate insulating layer 103 may be further etched. Accordingly, the first conductive layers 105 formed over the respective active regions are classified into a plurality of patterns, and the second conductive layers 111 are patterned as the first conductive lines WL and the second conductive lines SL to cross the active regions Ra, thereby forming the stack-type gates of the NAND flash memory device.

Figure 4B:
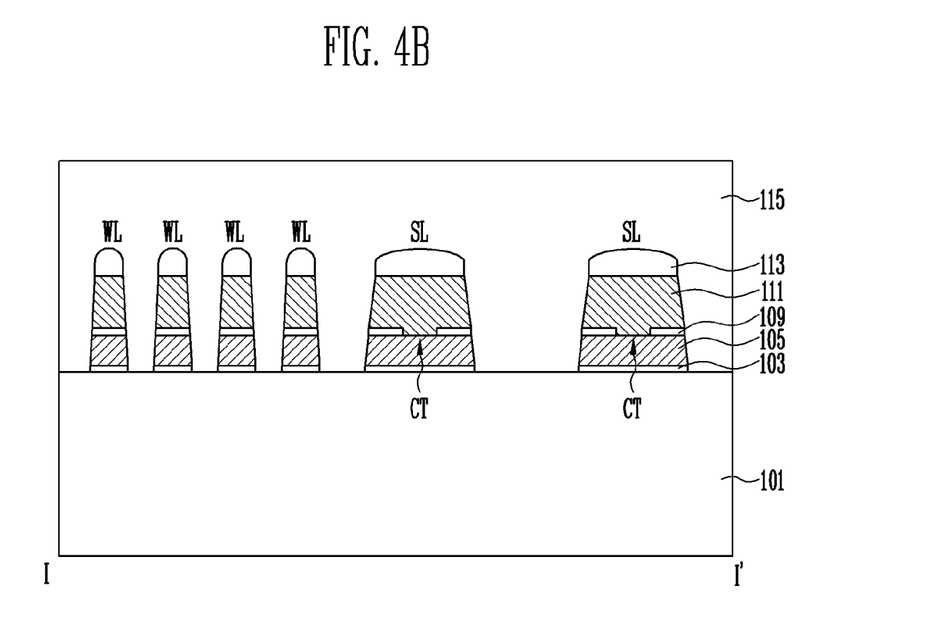

Referring to FIG. 4B, a gap-fill layer 115 is filled between the first conductive lines WL, between the first conductive lines WL and the second conductive lines SL adjacent to each other, and between the second conductive lines SL. The gap-fill layer 115 preferably is a Spin-On Carbon (SOC) layer. The Spin-On Carbon (SOC) layer is not formed along the topology of the entire surface including the first and the second conductive lines WL, SL, but can be flatly formed while filling the space between the first conductive lines WL, between the first conductive lines WL and the second conductive lines SL adjacent to each other, and between the second conductive lines SL. The first and the second conductive lines WL, SL are covered with the gap-fill layer 115 through the coating process of the Spin-On Carbon (SOC) layer.

Figure 4C:
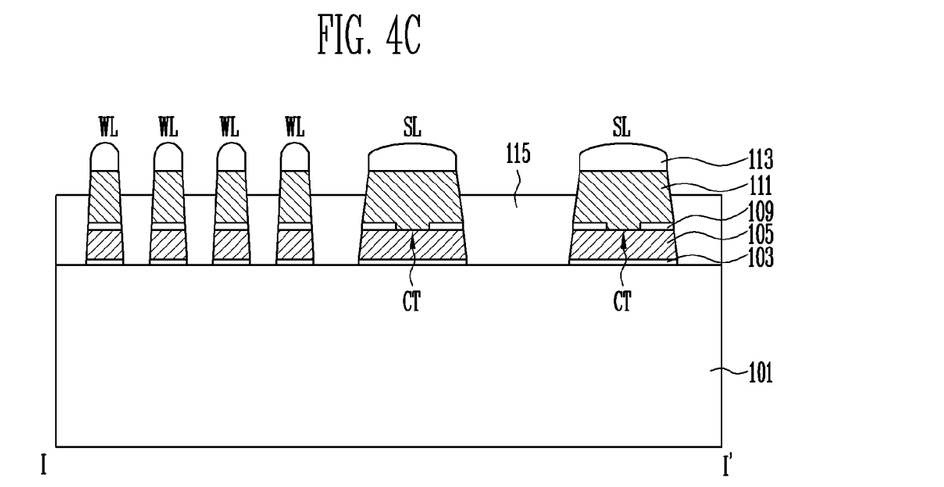

Referring to FIG. 4C, the gap-fill layer 115 is etched using an etch process, such as an etch-back process, to lower the height of the gap-fill layer 115 lower than a top surface of the first and the second conductive lines WL, SL by etching. The etch process of the gap-fill layer 115 stops at the height between the dielectric layer 109 and the second conductive layer 111. Accordingly, the sidewalls of upper portions of the first and the second conductive lines WL, SL are exposed.

Figure 4D:
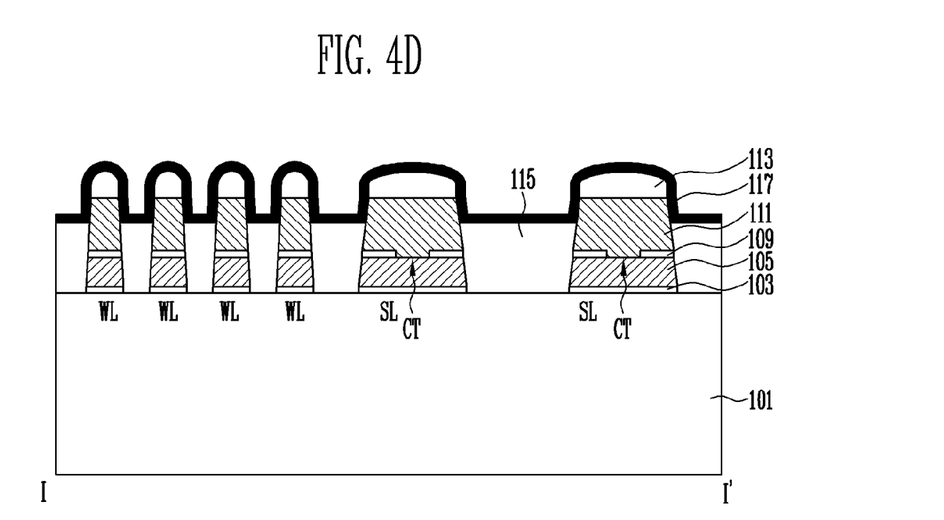

Referring to FIG. 4D, a thin layer 117 is formed on a top surface of the gap-fill layer 115 and a top surface of the first and the second conductive lines WL, SL. The thin layer 117 preferably is thinner than half (½) the gap between the first conductive lines WL so that the space between the first conductive lines WL is not fully filled with the thin layer 117. For example, the thickness of the thin layer 117 may be 40 to 50 Å. However, the thickness of the thin layer 117 is not limited to 40 to 50 Å, but may be various according to the design rule of the semiconductor memory device. The thin layer 117 preferably comprises a material having a high selectivity for the gap-fill layer 115. For example, the thin layer 117 preferably is formed of an Ultra Low Temperature Oxide (ULTO) layer deposited in a temperature of 40° C. to 90° C.

Figure 4E:
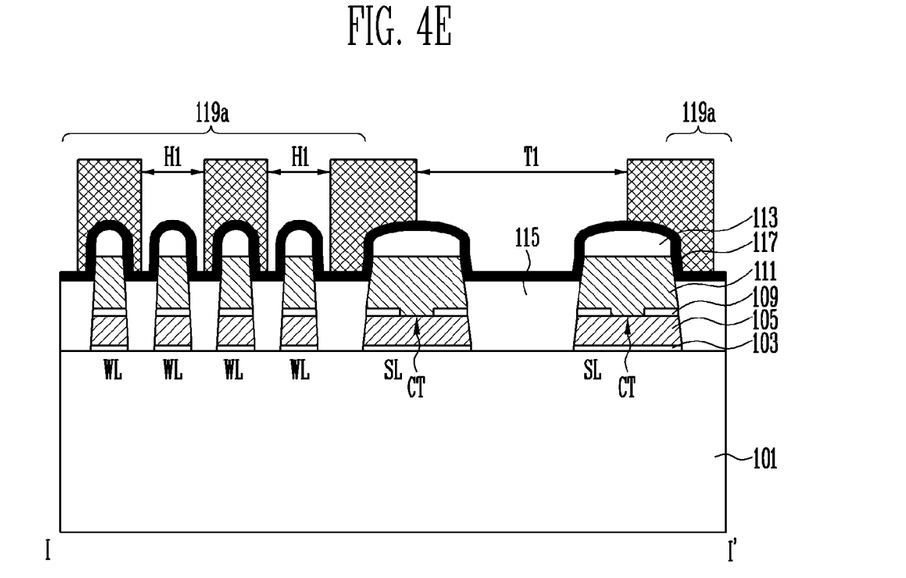

Referring to FIGS. 4E and 5, photoresist patterns 119a having first opening portions H1 through which the thin layer 117 is exposed are formed on the thin layer 117. The photoresist patterns 119a are spaced apart from each other with a first trench T1 interposed therebetween.

The photoresist patterns 119a are formed by patterning a photoresist layer using a photolithography process. For better patterning of the photoresist layer, the photoresist layer is formed of a planar type photoresist layer that is formed flat, without topology.

The first opening portions H1 overlap the first conductive lines WL and are arranged in parallel with respect to the first conductive lines WL. Furthermore, the first opening portions H1 are arranged in parallel diagonally with respect to the first conductive lines WL. Thus, the first opening portions H1 overlap the first conductive lines WL and are arranged in zigzag form. Accordingly, the formation process margin of the first opening portions H1 can be secured. Furthermore, to secure the formation process margin of the first opening portions H1, each of the first opening portions H1 defines an oval. The short axis of the oval preferably crosses the first conductive lines WL. The short axis of the oval preferably is longer than the width of the first conductive line WL to expose the thin layer 117 over the isolation region Rb. Furthermore, to prevent the first opening portions H1 from being coupled, the short axis of the oval is shorter than the pitch between the first conductive lines WL (here, the width of the first conductive line and the thickness of the thin layer 117 are the sum of the gaps between the first conductive lines WL so that the space between the first conductive lines WL is not filled with the thin layer 117). Furthermore, the short axis of the oval overlaps the central line of the isolation layer 107, and the center of each of the first opening portions H1 overlaps the central line of each of the first conductive lines WL.

The photoresist patterns 119a are separated from each other with the first trench T1 for opening a portion the thin layer 117 between the second conductive lines SL interposed therebetween. To expose the thin layer 117 between the second conductive lines SL, the edge of each of the photoresist patterns 119a overlaps a top surface of the second conductive line SL.

Meanwhile, to reduce each of the first opening portions H1 formed in the photoresist patterns 119a to a desired width, after forming the photoresist patterns 119a, a photoresist flow process for laterally extending the photoresist patterns 119a by applying heat to the photoresist patterns 119a preferably is further performed. In some embodiments, a process for reducing the width of a portion, opened through each of the first opening portions H1, to a desired width by forming a Resolution Enhancement Lithography Assisted by Chemical Shrink (hereinafter referred to as RELACS) material layer (not shown), cross-linked to the photoresist patterns 119a, on the surface of each of the photoresist patterns 119a preferably is further performed. The RELACS material layer (not shown) cross-linked to the photoresist patterns 119a preferably is formed using the following method. First, the RELACS material layer is spin-coated on the entire surface having the photoresist patterns 119a formed thereon. The RELACS material layer comprises a water-soluble polymer and a cross linker. Next, baking is performed by applying heat to the entire structure having the RELACS material layer coated thereon, so that the RELACS material layer is cross-linked to the surface of each of the photoresist patterns 119a. Next, the remaining RELACS material layer other than the RELACS material cross-linked to the surface of each of the photoresist patterns 119a is removed.

Figure 4F:
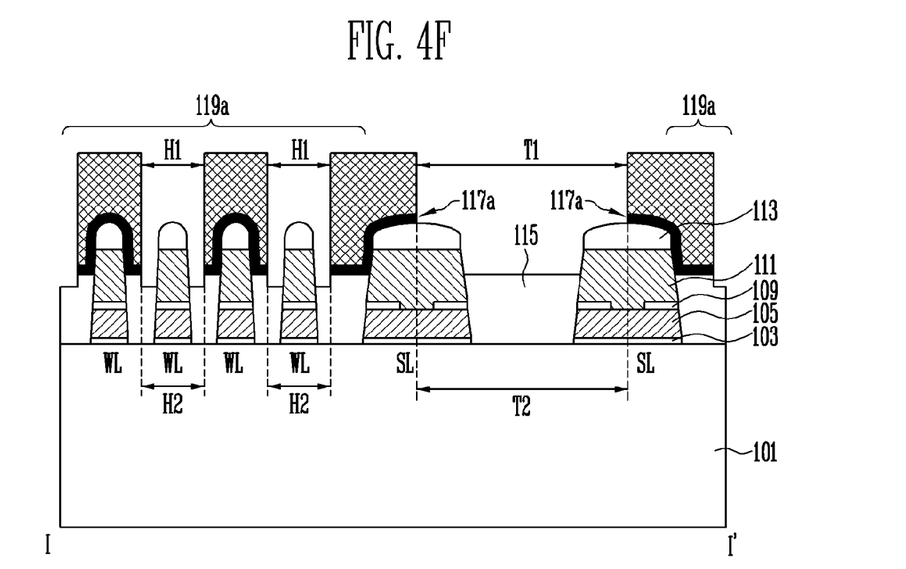

Referring to FIG. 4F, thin film patterns 117a are formed by removing the exposed regions of the thin layer 117 using the photoresist patterns 119a as a mask. The thin film patterns 117a have the same shape as the photoresist patterns 119a. That is, each of the thin film patterns 117a has a second opening portion H2 through which part of the gap-fill layer 115 is exposed. Furthermore, the thin film patterns 117a are spaced apart from each other with a second trench T2 interposed therebetween.

The second opening portions H2 overlap the first conductive lines WL and are arranged in parallel to the first conductive lines WL. Furthermore, the second opening portions H2 are arranged in parallel in a diagonal direction of the first conductive lines WL. That is, the second opening portions H2 overlap the first conductive lines WL and arranged in zigzag form. Furthermore, each of the second opening portions H2 defines an oval, and the short axis of the oval preferably crosses the first conductive lines WL. The short axis of the oval preferably is longer than the width of the first conductive line WL, but shorter than the pitch between the first conductive lines WL. Furthermore, the short axis of the oval overlaps the central line of the isolation layer, and the center of each of the second opening portions H2 overlaps the central line of each of the first conductive lines WL. Furthermore, the thin film patterns 117a are separated from each other with the second trench T2 for opening the gap-fill layer 115 between the second conductive lines SL interposed therebetween. The edge of each of the thin film patterns 117a overlaps the top surface of the second conductive lines SL.

The process of etching the thin layer is stopped with the gap-fill layer 115 remained.

Figure 4G:
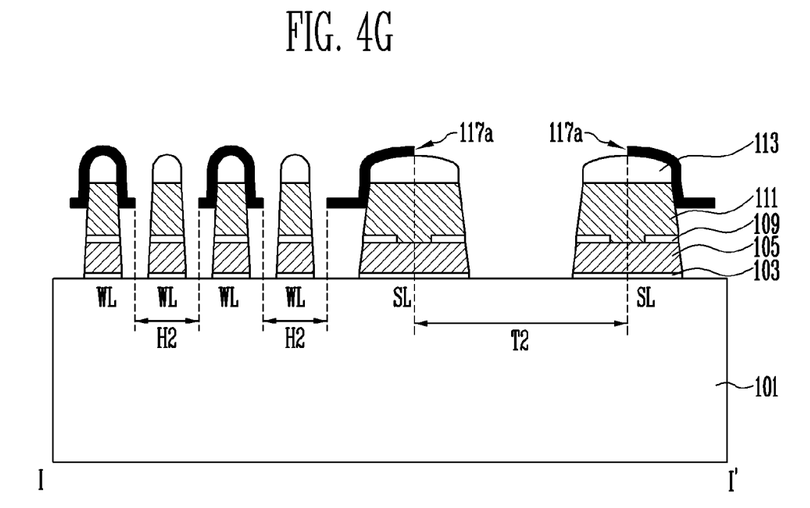

Referring to FIG. 4G, all the remaining regions of the gap-fill layer 115 are fully removed through the second opening portions H2 and the second trench T2. When the gap-fill layer 115 is formed of a Spin-On Carbon (SOC) layer, the photoresist pattern, together with the gap-fill layer 115, is also removed through a polymer strip process of removing the gap-fill layer 115.

Figure 4H:
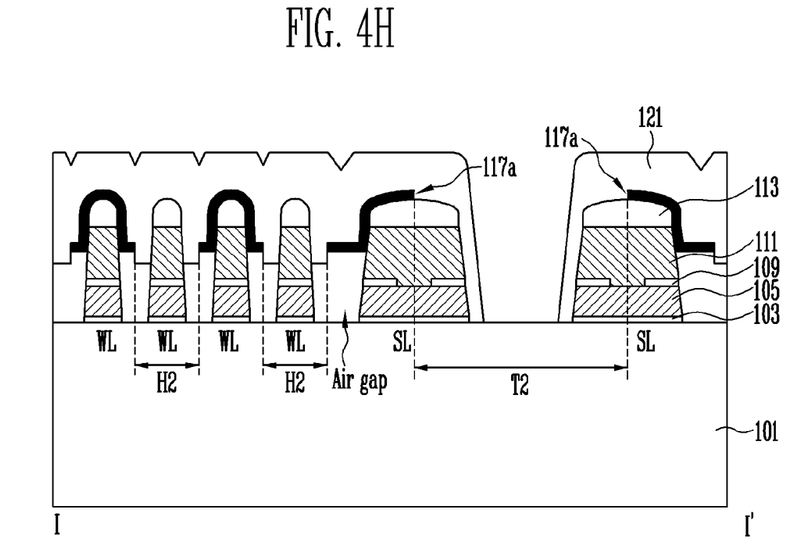

Referring to FIG. 4H, an insulating layer, such as a Tetra-Ethly-Ortho-Silicate (TEOS) oxide layer, for example, is deposited on the entire surface, including the thin film patterns 117a having the second opening portions H2. When the insulating layer is initially deposited, a relatively narrow space between the thin film pattern 117a and the first conductive line WL is filled in the state in which the lower portion of the space between the first conductive lines WL is not fully filled. Accordingly, an air gap is formed between the first conductive lines WL. Furthermore, the insulating layer is filled between the space, narrower than the space between the second conductive lines SL and between the first conductive lines WL corresponding to an upper portion of the air gap, and the space between the first conductive line WL and the second conductive line SL. Meanwhile, a relatively wide space between the second conductive lines SL is not fully filled with the insulating layer, but the insulating layer formed between the second conductive lines SL is formed along a topology due to the second conductive lines SL.

Next, a spacer 121 is formed by etching the insulating layer using an etch process, such as an etch-back process, until the semiconductor substrate 101 between the second conductive lines SL is exposed. The spacer 121 is formed on the sidewalls of the second conductive lines SL, and the space between the first conductive lines WL, corresponding to the upper portion of the air gap, and the second opening portions H2 remains filled with the spacer 121.

The spacer 121 formed on the sidewalls of the second conductive lines SL may prevent the second conductive lines SL from being exposed when a contact formation process for exposing the semiconductor substrate 101 between the second conductive lines SL is performed in a subsequent process.

As described above, in the first exemplary embodiment of this disclosure, the thin film patterns 117a are formed to expose the space between the first conductive lines WL through the opening portions H2 in a width narrower than the width of the gap between the first conductive lines WL, and the insulating layer is formed on the thin film pattern 117a. Next, in the state in which the space between the first conductive lines WL on the lower portion of the thin film pattern 117a and the insulating layer is generally filled with air, the opening portions H2 each having a narrow width are filled with the insulating layer. Accordingly, in the first exemplary embodiment of this disclosure, a ratio that the space between the first conductive lines WL is filled with the insulating layer can be reduced, and a ratio that the space between the first conductive lines WL is filled with air, which has a smaller dielectric constant than the insulating layer, can be increased. An interference phenomenon between the first conductive lines WL is proportional to capacitance C between the first conductive lines WL. The capacitance C between the first conductive lines WL is determined by an area A in which the first conductive lines WL face each other, the gap d between the first conductive lines WL, and a dielectric constant $\in_r$ filling the space between the first conductive lines WL, as shown in Equation 1 below. For reference, the dielectric constant $\in_0$ is a dielectric constant of vacuum.

$$C = \in_r \in_0 (A/d) \qquad \text{[Equation 1]}$$

The dielectric constant of air is lower than the dielectric constant of the insulating layer. Accordingly, in the first exemplary embodiment of this disclosure, a proportion of space occupied by air in the space between the first conductive lines WL can be increased, and an interference phenomenon between the first conductive lines WL can thus be improved, i.e., reduced.

Figure 6:
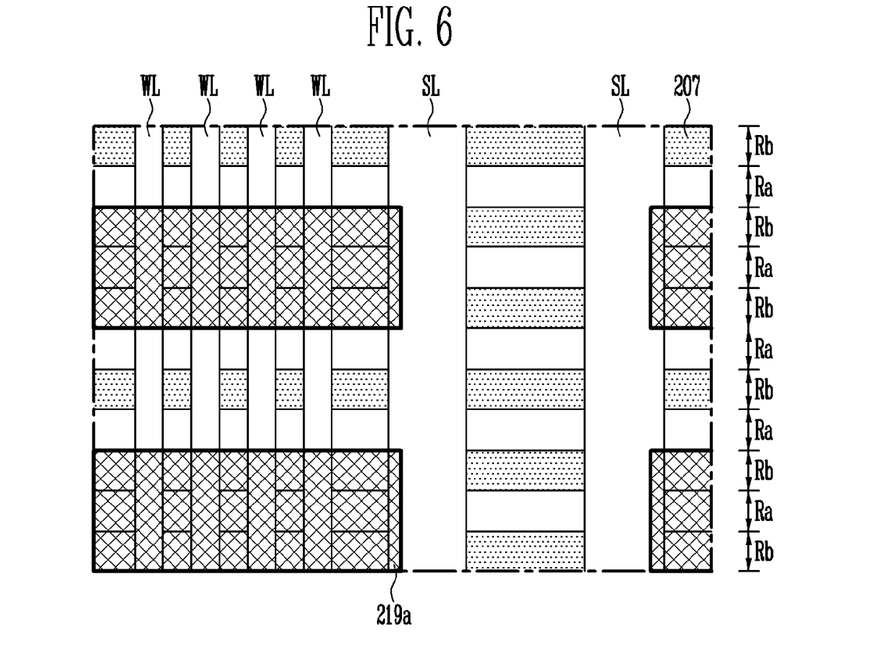
Figure 7:
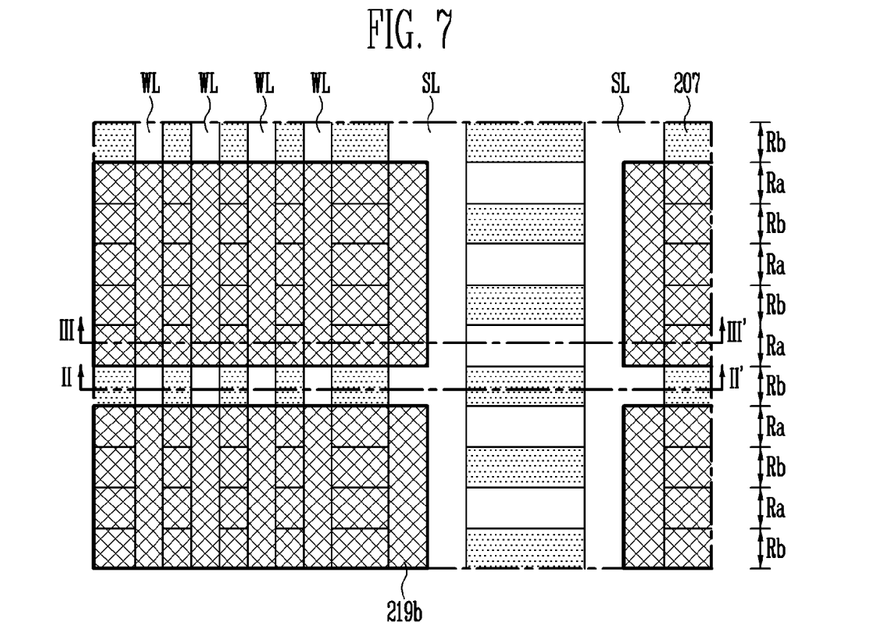
Figure 8A:
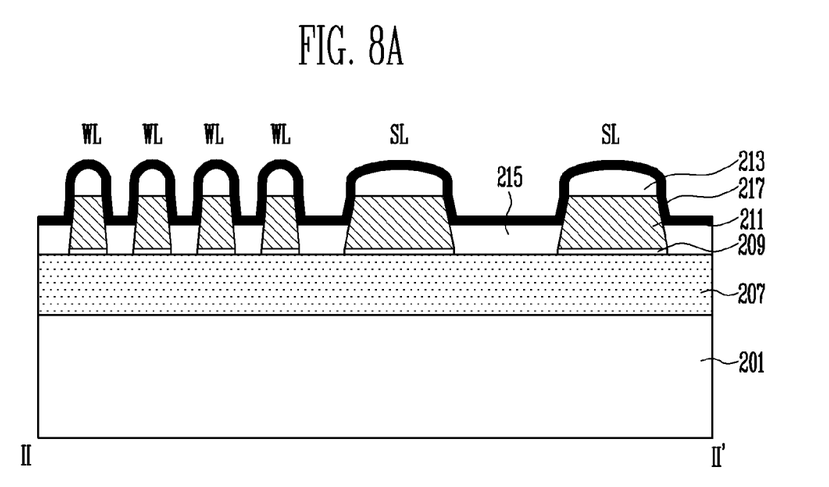
Figure 8B:
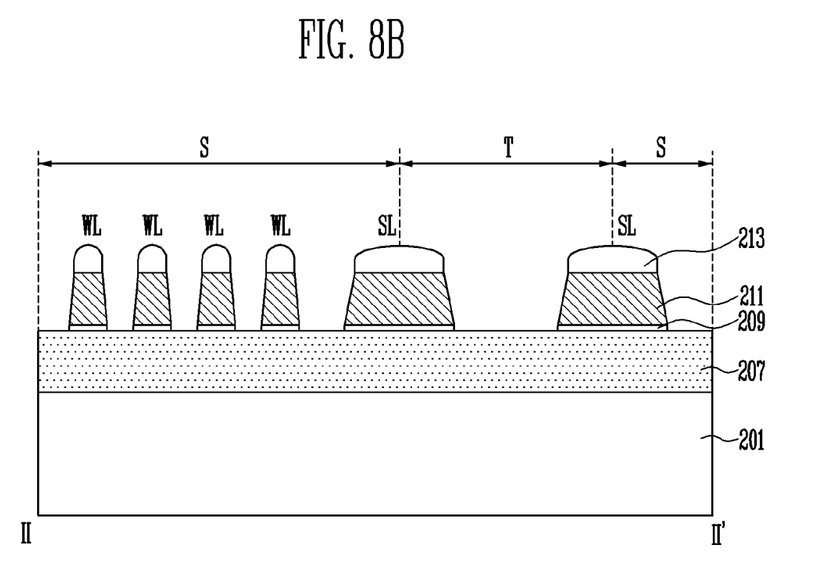
Figure 8C:
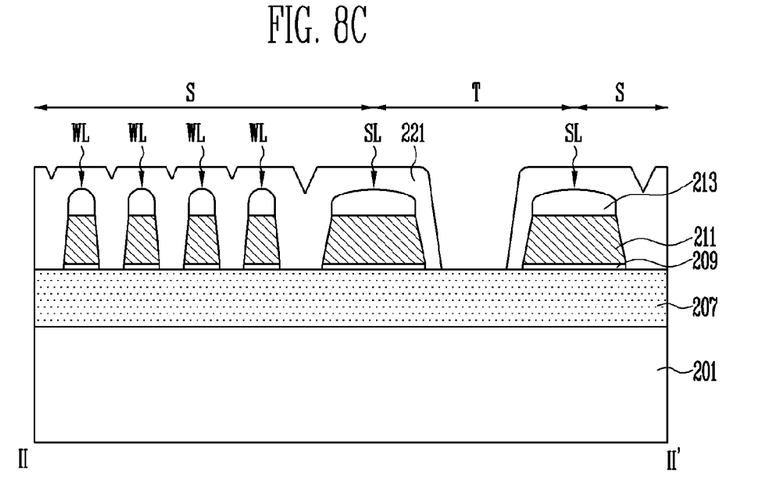
Figure 9A:
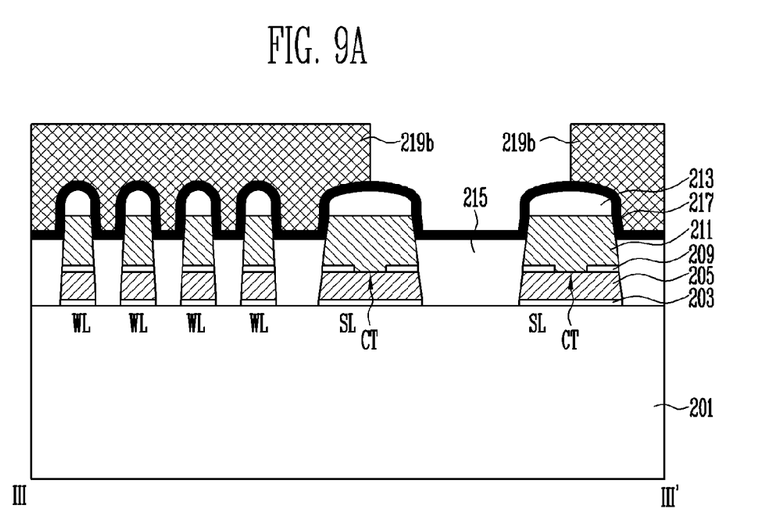
Figure 9B:
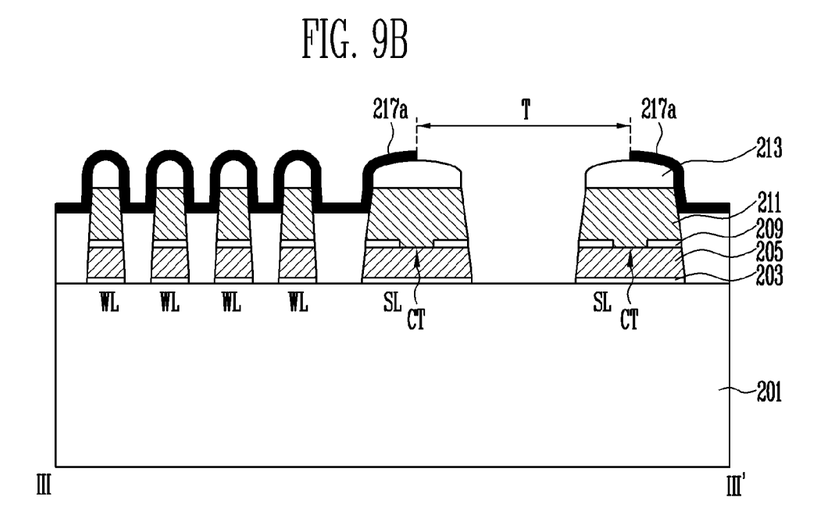
Figure 9C:
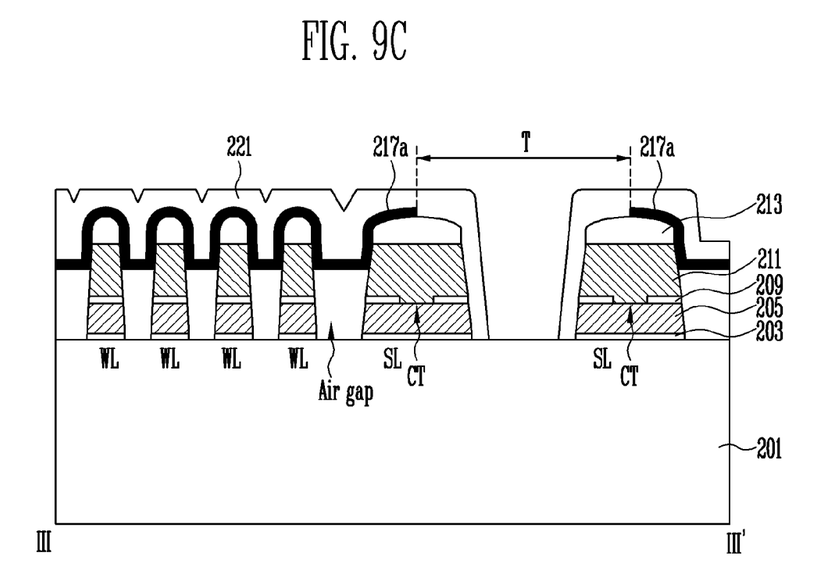

Hereinafter, a semiconductor memory device and a method of manufacturing the same according to a second exemplary embodiment of this disclosure are described below with reference to FIGS. 6 to 9C. FIGS. 6 and 7 are diagrams illustrating the layout of conductive lines and photoresist patterns according to the second exemplary embodiment of this disclosure. FIGS. 8A to 8C are cross-sectional views of isolation regions taken along line II-II' in FIG. 7. Furthermore, FIGS. 9A to 9C are cross-sectional views of active regions taken along line III-III' in FIG. 7.

Referring to FIG. 6, first conductive lines WL and second conductive lines SL are formed over a semiconductor substrate that defines active regions Ra partitioned by isolation regions Rb. The first conductive lines WL cross active regions Ra and are spaced apart from each other. The second conductive lines SL are parallel to the first conductive lines WL and each has a width greater than the first conductive lines WL. An isolation layer 207 is formed in each of the isolation regions Rb. An arrangement relationship between the first conductive lines WL and the second conductive lines SL is the same as shown in FIG. 3, and a description thereof is omitted. The first conductive lines WL are illustratively the word lines of a NAND flash memory device, and the second conductive lines SL are illustratively the select lines of the NAND flash memory device. The select lines are classified into source select lines and drain select lines.

The first conductive lines WL and the second conductive lines SL preferably are formed using the same method as described with reference to FIG. 4A.

A gap-fill layer is filled between the first conductive lines WL, between the first conductive lines WL and the second conductive lines SL adjacent to each other, and between the second conductive lines SL by using same manner as described with reference to FIGS. 4B and 4C. The gap-fill layer is etched using an etch process, such as an etch-back process. Accordingly, the upper sidewalls of the first and the second conductive lines WL, SL are exposed.

Next, a thin layer is formed, preferably in the same manner as described with reference FIG. 4D. Photoresist patterns 219a spaced apart from each other are formed over the thin layer. In the second exemplary embodiment of this disclosure, the photoresist patterns 219a are formed in a line form parallel to the active regions Ra, unlike in the first exemplary embodiment of this disclosure. Furthermore, the photoresist patterns 219a are spaced apart from each other not only in a direction crossing the active regions Ra, but in a direction parallel to the active regions Ra. The photoresist patterns 219a preferably are formed by depositing a photoresist layer on the thin layer and patterning the photoresist layer using exposure and development processes. For better patterning of the photoresist layer, the photoresist layer is formed of a planar type photoresist layer, which is flat without topology.

Assuming that the width of each of the active regions Ra is A and the interval between the active regions Ra is B, the photoresist patterns 219a arranged in parallel with respect to the first conductive lines WL may be spaced apart from each other at an interval of 2A+B. Furthermore, each of the photoresist patterns 219a preferably have a width of A+2XB (where X is a natural number). Furthermore, the edges of the photoresist patterns 219a overlap a top surface of the second conductive lines SL.

Referring to FIG. 7, to narrow the width of regions opened through the photoresist patterns, a photoresist flow process for laterally extending each of the photoresist patterns 219a by applying heat to the photoresist patterns 219a, which has been described with reference to FIG. 6, preferably is further performed. Accordingly, as shown in FIG. 7, the photoresist patterns 219b laterally extended are formed.

Unlike in the above method, to narrow the width of the regions opened through the photoresist patterns, a Resolution Enhancement Lithography Assisted by Chemical Shrink (RELACS) material layer (not shown) cross-linked to the photoresist patterns 219a preferably is formed on the surface of each of the photoresist patterns 219a. The RELACS material layer cross-linked to the photoresist patterns 219a preferably is formed using the same method as described with reference to FIG. 4E.

As described above with reference to FIG. 6, when the photoresist patterns 219a each having the width A+2XB (where X is a natural number) are arranged at intervals of 2A+B with them spaced apart from each other, the laterally extended photoresist patterns 219b or the photoresist patterns cross-linked to the RELACS material layer are spaced apart from each other by the width of the isolation region Rb in the direction of the word lines. Furthermore, the opening portions may overlap the isolation regions Rb through the laterally extended photoresist patterns 219b or the photoresist patterns cross-linked to the RELACS material layer by controlling the arrangement of the exposure mask when an exposure process is performed.

As a result of the process in FIG. 6, as shown in FIGS. 8A and 9A, part of a thin layer 217 over the isolation regions Rb is exposed, and part of the thin layer 217 between the second conductive lines SL is exposed.

Referring to FIGS. 8A and 9A, when the first conductive lines WL and the second conductive lines SL are the word lines and the select lines of a NAND flash memory device, each of the first conductive lines WL and the second conductive lines SL is coupled to a stack-type gate, illustratively having a stack structure of a gate insulating layer 203, a first conductive layer 205, a dielectric layer 209, and a second conductive layer 211. A contact hole CT through which the first conductive layer 205 is exposed is formed in the dielectric layer 209 of the stack-type gate to which the second conductive line SL is coupled. The first conductive layer 205 and the second conductive layer 211 are electrically coupled through the contact hole CT. The gate insulating layer 203 of the stack-type gate to which the first conductive lines WL are coupled becomes a tunnel insulating layer, and the first conductive layer 205 of the stack-type gate becomes a floating gate (i.e., a charge trap layer). A gate hard mask pattern 213 preferably is further stacked over the second conductive layer 211.

As described above with reference to FIG. 6, the first conductive lines WL and the second conductive lines SL preferably are formed using the same method as described above with reference to FIG. 4A. Furthermore, as described above with reference to FIG. 6, a gap-fill layer 215 through which the upper sidewalls of the first and the second conductive lines WL, SL are exposed is formed between the first conductive lines WL, between the first conductive lines WL and the second conductive lines SL adjacent to each other, and the second conductive lines SL, using the same method as FIGS. 4B and 4C. A material constituting the gap-fill layer 215 preferably is also the same as that described above with reference to FIG. 4B. Furthermore, as described above with reference to FIG. 6, the thin layer 217 is formed on a top surface of the gap-fill layer 215 and on a surface of the first and the second conductive lines WL, SL using the same method as described above with reference to FIG. 4D. The thickness of the thin layer 217 and the material of the thin layer 217 preferably are also the same as described above with reference to FIG. 4D.

Referring to FIGS. 8B and 9B, thin film patterns 217a are formed by removing the exposed region of the thin layer using the photoresist patterns 219b as a mask. The thin film patterns 217a are formed in the same shape as the photoresist patterns 219a. In other words, the thin film patterns 217a are formed in parallel to the active regions. Furthermore, the thin film patterns 217a are spaced apart from each other with an opening portion S interposed therebetween in a direction crossing the active regions and are also spaced apart from each other with a trench T interposed therebetween in a direction parallel to the active regions. Furthermore, the opening portion S is formed to have the same width as the isolation region and is overlapped with the isolation region. Furthermore, the gap-fill layer between the second conductive lines SL is exposed, and the edges of the thin film patterns 217a overlap the top surfaces of the second conductive lines SL.

Next, all the remaining regions of the gap-fill layer are removed through the opening portions S and the trenches T between the thin film patterns 217a. When the gap-fill layer is a Spin-On Carbon (SOC) layer, the photoresist patterns, together with the gap-fill layer, are removed through a polymer strip process for removing the gap-fill layer.

Referring to FIGS. 8C and 9C, an insulating layer, such as a Tetra-Ethly-Ortho-Silicate (TEOS) oxide layer, for example, is deposited on the entire surface including the thin film patterns 217a. Here, the space between the first conductive lines WL on a lower portion of the thin film patterns 217a is blocked by the thin film patterns 217a. Thus, the insulating layer is not formed in the space between the first conductive lines WL on the lower portion of the thin film patterns 217a, but an air gap is formed therein. Meanwhile, the space between the first conductive lines WL over the thin film patterns 217a, the opening portion S, and the space between the first conductive lines WL and the second conductive lines SL are filled with the insulating layer because they are relatively narrower than the space between the second conductive lines SL. Furthermore, the relatively wide space between the second conductive lines SL is not filled with the insulating layer, and the insulating layer formed between the second conductive lines SL is formed along a topology due to the second conductive lines SL.

Next, a spacer 221 is formed by etching the insulating layer using an etch process, such as an etch-back process, until the semiconductor substrate 201 between the second conductive lines SL is exposed. The spacer 221 is formed on the sidewalls of the second conductive lines SL. Furthermore, the space between the first conductive lines WL over the thin film patterns 217a and the opening portion S between the thin film patterns 217a remain filled with the spacer 221.

The spacer 221 formed on the sidewalls of the second conductive lines SL may prevent the second conductive lines SL from being exposed when a contact formation process for exposing the semiconductor substrate 201 between the second conductive lines SL is performed in a subsequent process.

As described above, in the second exemplary embodiment of this disclosure, the thin film patterns 217a prevent the space between the first conductive lines WL below the thin film patterns 217a from being filled with the insulating layer, and the space between the first conductive lines WL below the thin film patterns 217a therefore can be filled with air. According to the second exemplary embodiment of this disclosure, a ratio that the space between the first conductive lines WL is filled with the insulating layer can be reduced, and a ratio that the space between the first conductive lines WL is filled with air having a smaller dielectric constant than the insulating layer can be increased. Consequently, as in the first exemplary embodiment of this disclosure, an interference phenomenon between the first conductive lines WL can be improved, i.e., reduced.

According to the present disclosure, a lower portion of the space is opened in a narrow width through the thin film pattern or is blocked by the thin film pattern so that an upper portion of the space can be filled with the insulating material with the lower portion of the space between the conductive lines being filled with air. Accordingly, the present disclosure can reduce a proportion that the space is filled with the insulating layer and can improve an interference phenomenon between the conductive lines by increasing the ratio that air having a smaller dielectric constant than the insulating layer is filled. Consequently, the present disclosure can reduce the deterioration of a program threshold voltage distribution characteristic of memory cells due to the interference phenomenon between the conductive lines.

What is claimed is:

1. A method of forming a semiconductor memory device, comprising:
    forming conductive lines spaced apart from each other and crossing active regions that are partitioned by an isolation region over a semiconductor substrate that defines the active regions;
    filling a gap-fill layer between the conductive lines;
    etching the gap-fill layer to lower a height of the gap-fill layer lower than a top surface of the conductive lines and to expose upper sidewalls of the conductive lines;
    forming a thin film pattern having opening portions to expose part of the gap-fill layer on a top surface of the gap-fill layer and on a surface of the conductive lines;
    removing remaining portions of the gap-fill layer; and
    forming an insulating layer on the thin film pattern to fill the opening portions, thereby forming an air gap between the conductive lines below the insulating layer and the thin film pattern.

2. The method of claim 1, comprising forming the thin film pattern by:
    forming a thin layer on a top surface of the gap-fill layer and on the surface of the conductive lines;
    forming a photoresist pattern having opening portions over the thin layer to expose part of the thin layer;
    removing the exposed regions of the thin layer using the photoresist pattern as a mask; and
    removing the photoresist pattern.

3. The method of claim 2, comprising removing the photoresist pattern simultaneously with the gap-fill layer.

4. The method of claim 2, comprising forming the thin film pattern by reducing a width of each of the opening portions of the photoresist pattern by laterally extending the photoresist pattern by applying heat to the photoresist pattern after forming the photoresist pattern.

5. The method of claim 2, comprising forming the thin film pattern by reducing a width of each of the opening portions of the photoresist pattern by forming a Resolution Enhancement Lithography Assisted by Chemical Shrink (RELACS) material layer that is cross-linked to the photoresist pattern on a surface of the photoresist pattern, after forming the photoresist pattern.

6. The method of claim 1, wherein the opening portions are overlap the conductive lines and are arranged in parallel diagonally with respect to the conductive lines.

7. The method of claim 1, wherein each of the opening portions defines an oval.

8. The method of claim 7, wherein:
    a short axis of the oval crosses the conductive lines and is longer than a width of the conductive line and shorter than a pitch between the conductive lines.

9. The method of claim 1, wherein the gap-fill layer is a Spin-On Carbon (SOC) layer.

10. The method of claim 1, wherein the thin film pattern is an Ultra Low Temperature Oxide (ULTO) layer.

11. The method of claim 1, wherein the thin film pattern has a thickness smaller than half a distance between the conductive lines.

12. A method of forming a semiconductor memory device, comprising:
    forming conductive lines spaced apart from each other and crossing active regions partitioned by an isolation region, over a semiconductor substrate that defines the active regions;
    filling a gap-fill layer between the conductive lines;
    etching the gap-fill layer to lower a height of the gap-fill layer lower than a top surface of the conductive lines and to expose upper sidewalls of the conductive lines;
    forming thin film patterns spaced apart from each other and parallel to the active regions on a top surface of the gap-fill layer and on a surface of the conductive lines to expose the gap-fill layer in a space between the thin film patterns;
    removing remaining portions of the gap-fill layer; and
    forming an air gap between the conductive lines below each of the thin film patterns by filling the space between the thin film patterns with an insulating layer.

13. The method of claim 12, comprising forming the thin film patterns by:
    forming a thin layer on the top surface of the gap-fill layer and on the surface of the conductive lines;
    forming photoresist patterns spaced apart from each other over the thin layer;
    removing part of the thin layer exposed between the photoresist patterns; and
    removing the photoresist patterns.

14. The method of claim 13, comprising removing the photoresist patterns simultaneously with the gap-fill layer.

15. The method of claim 13, comprising forming the thin film patterns by reducing a width of an opening portion between the photoresist patterns by laterally extending each of the photoresist patterns by applying heat to the photoresist patterns after forming the photoresist patterns.

16. The method of claim 13, comprising forming the thin film patterns by reducing a width of an opening portion between the photoresist patterns by forming a Resolution Enhancement Lithography Assisted by Chemical Shrink (RELACS) material layer cross-linked to the photoresist pattern on a surface of each of the photoresist patterns after forming the photoresist pattern.

17. The method of claim 12, wherein:
   the space between the thin film patterns has a width identical to the width of the isolation region and overlapping the isolation region.

18. The method of claim 12, wherein the gap-fill layer is a Spin-On Carbon (SOC) layer.

19. The method of claim 12, wherein each of the thin film patterns is an Ultra Low Temperature Oxide (ULTO) layer.

20. The method of claim 12, wherein each of the thin film patterns has a thickness smaller than half a distance between the conductive lines.

\* \* \* \* \*